(12) United States Patent
De La Reza et al.

(10) Patent No.: US 7,931,479 B1
(45) Date of Patent: Apr. 26, 2011

(54) BUSSED ELECTRICAL CENTER WITH COMBINATION ELECTRICAL AND MECHANICAL CONNECTION

(75) Inventors: Alvaro Gino De La Reza, El Paso, TX (US); Mark Wayne Smith, El Paso, TX (US); Erick A. Rodriguez, Chihuahua (MX)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/619,958

(22) Filed: Nov. 17, 2009

(51) Int. Cl.
*H01R 12/00* (2006.01)
*H05K 1/00* (2006.01)

(52) U.S. Cl. .................................. 439/76.2; 439/949

(58) Field of Classification Search ............... 439/76.2, 439/364, 949; 361/641
See application file for complete search history.

(56) References Cited

U.S. PATENT DOCUMENTS

| | | | |
|---|---|---|---|
| 4,954,085 A | 9/1990 | Inoue et al. | |
| 4,957,449 A | 9/1990 | Hatagishi | |
| 5,000,693 A | 3/1991 | Hatagishi et al. | |
| 5,023,752 A * | 6/1991 | Detter et al. | 361/752 |
| 5,480,322 A | 1/1996 | Ishii et al. | |
| 5,645,457 A * | 7/1997 | Hirayama et al. | 439/801 |
| 5,788,529 A | 8/1998 | Borzi et al. | |
| 5,919,057 A | 7/1999 | Kameyama | |
| 5,971,796 A | 10/1999 | Duhr | |
| 6,027,360 A | 2/2000 | Jenkins | |
| 6,050,839 A | 4/2000 | Seminara et al. | |
| 6,077,102 A | 6/2000 | Borzi et al. | |
| 6,126,458 A | 10/2000 | Gregory, II et al. | |
| 6,322,376 B1 * | 11/2001 | Jetton | 439/76.2 |
| 6,443,779 B2 | 9/2002 | Suzuki | |
| 6,679,708 B1 * | 1/2004 | Depp et al. | 439/76.2 |

* cited by examiner

*Primary Examiner* — Hae Moon Hyeon
(74) *Attorney, Agent, or Firm* — Thomas N. Twomey

(57) ABSTRACT

A bussed electrical center has a power cable for feeding electrical power to the bussed electrical center. A printed circuit board subassembly is interposed between a first housing member and a second housing member that are connectable together. An electrically conductive connector has a prong end and a distal end. The prong end is operably connected to the printed circuit board subassembly. A first fastener and a second fastener are positioned on opposite sides of the first and second housing members. When the first and second fasteners are tightened together to a draw the first and second housing members together to mechanically fasten the bussed electrical center together, the distal end and the terminal end are pressed against each other for electrical connection to each other to electrically connect the power cable to the printed circuit board subassembly.

6 Claims, 3 Drawing Sheets

US 7,931,479 B1

BUSSED ELECTRICAL CENTER WITH COMBINATION ELECTRICAL AND MECHANICAL CONNECTION

TECHNICAL FIELD

The field of this invention relates to bussed electrical centers used in automotive vehicle electrical systems.

BACKGROUND OF THE DISCLOSURE

A bussed electrical center (often referred to as a BEC) is commonly found in an automotive vehicle. A bussed electrical center typically has a lower housing and upper housing that contains a printed circuit board with various electrical components, for example fuses and relays. The bottom side of the printed circuit board has connectors that engage through the lower housing to a connector assembly. A power cable from the battery is also connected to the printed circuit board to power the various electrical components of the automotive vehicle.

SUMMARY OF THE DISCLOSURE

In accordance with one aspect of the invention, a bussed electrical center has a power cable for feeding electrical power to the bussed electrical center. The power cable has a terminal end. A printed circuit board subassembly is interposed between a lower housing and an upper housing that are connectable together.

An electrically conductive connector has a prong end and a distal end with the prong end being operably connected to the printed circuit board subassembly. The distal end of the connector and the terminal end of the power cable are adjacent each other. A first fastener is positioned below the connector assembly and is operably engageable to a second fastener. When the first and second fasteners are tightened together to draw the first and second housing members together to mechanically fasten the bussed electrical center together, the distal end and the terminal end are pressed against each other for electrical connection to each other to electrically connect the power cable to the printed circuit board subassembly.

Preferably, the distal end of the electrically conductive connector is in the form of a ring and mounted about one of the fasteners. The terminal end of the power cable in the form of a ring mounted about one of the fasteners. The first and second housing and printed circuit board subassembly are positioned on one side of the terminal end and distal end. A connector assembly is positioned on another side of the terminal end and distal end. The distal end and terminal end are interposed and between a pair of respective shoulders of the fasteners or the first housing member and connector assembly.

In one embodiment, a compression ring is positioned between the first and second fasteners for providing a compression force as the fasteners are tightened together. The first fastener can be a stud that is externally threaded and has a first shoulder section engaging one of the housing members and also has a second shoulder. The second fastener can be a threaded sleeve that is internally threaded and has one shoulder engaging the other of the housing members and also has a second end shoulder at an end of the sleeve opposing the second shoulder of the stud. The compression ring, distal end of the electrically conductive connector and the terminal end of the power cable are interposed between the second shoulder of the stud and second shoulder of the threaded sleeve.

BRIEF DESCRIPTION OF THE DRAWINGS

Reference now is made to the accompanying drawings in which.

DETAILED DESCRIPTION OF THE PREFERRED EMBODIMENT

Figure 1:
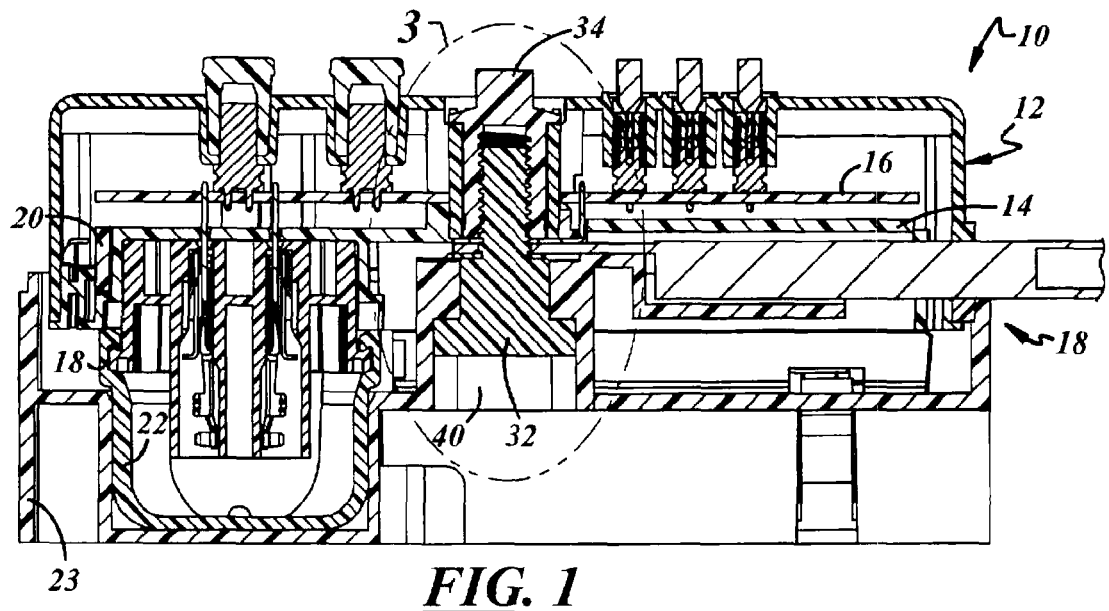
FIG. 1 is a cross sectional view of a bussed electrical center in accordance with one embodiment of the invention.
Figure 2:
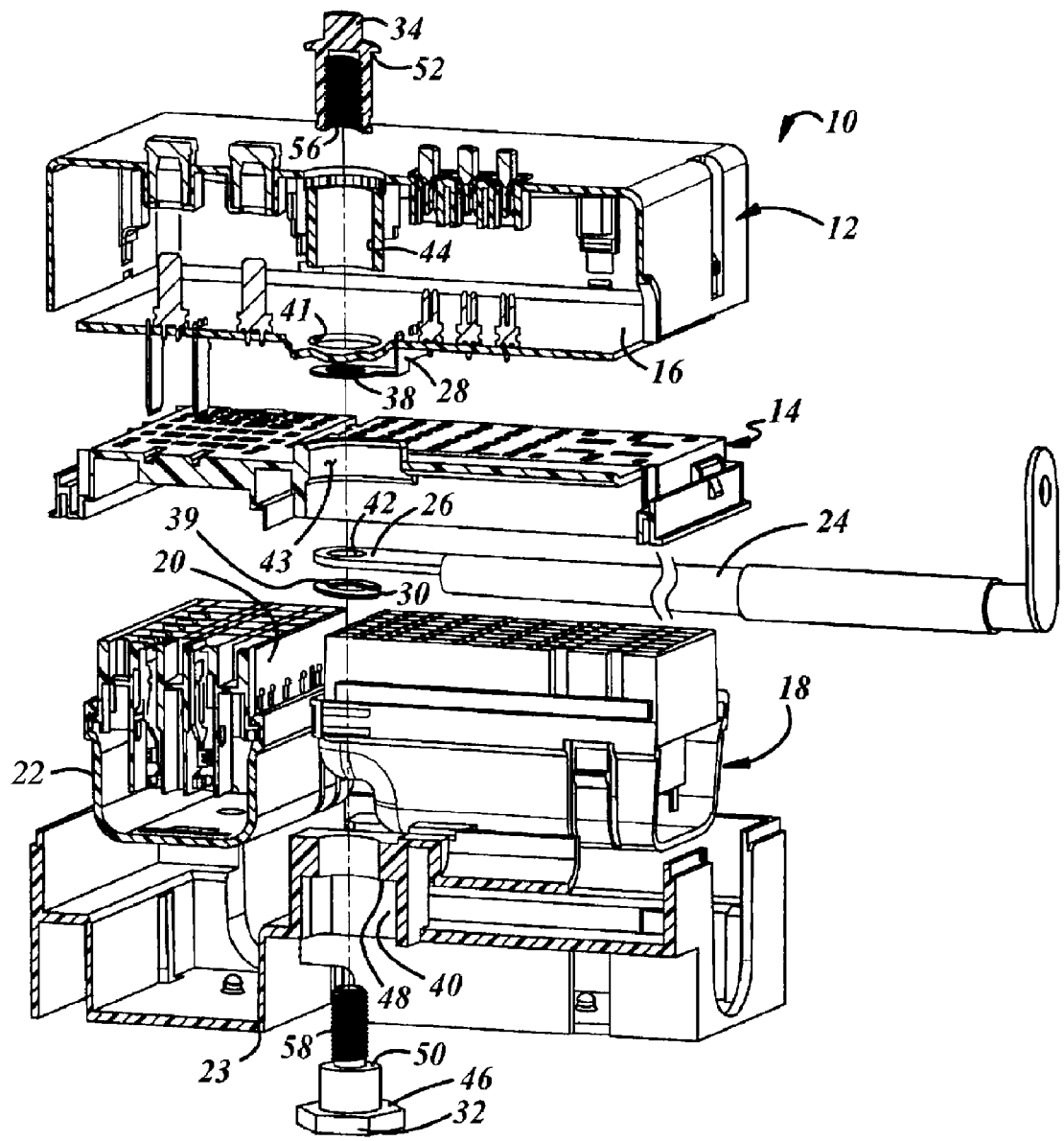
FIG. 2 is an exploded perspective view of the bussed electrical center shown in FIG. 1.

Referring now to FIGS. 1 and 2, a bussed electrical center (BEC) 10 has a first or upper housing 12, and a second or lower housing 14 that houses a printed circuit board subassembly 16. The lower housing 14 may include or connect to a connector assembly 18 that is operably connected to the printed circuit board via standard terminal connection (not shown). The connector assembly 18 is connected to an outgoing wire bus (not shown). The connector assembly 18 may be a multi-unit part with a terminal housing 20 and a lower base housing 22 or a one piece unit. A bracket housing 23 can be mounted to an appropriate part of the motor vehicle and also can function as a protective splash-shield.

A power cable 24 laterally extends into the BEC 10 between the lower housing 14 and the connector assembly 18. The power cable 24 leads to an electric power supply (not shown) such as a positive terminal of a battery installed in a motor vehicle.

Figure 3:
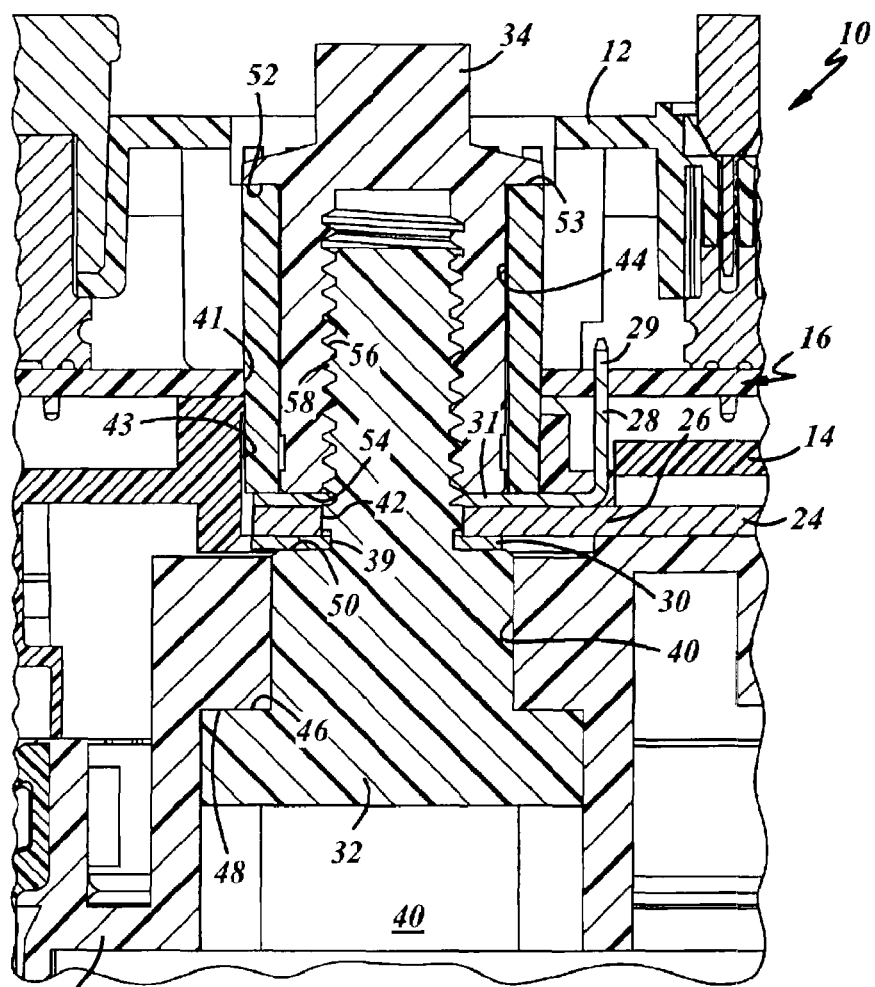
FIG. 3 is an enlarged view of the combination electrical and mechanical connection shown in FIG. 1.

As better shown in FIG. 2 and FIG. 3, the power cable 24 has a terminal end 26 that is ring shaped. A stamped metal connector ring 28 is operably connected to the printed circuit board subassembly 16 through a prong end 29. The ring portion or distal end 31 is adjacent the terminal end 26. The connector ring 28 may be made of other material and formed by other methods as long as it remains electrically conductive. A compression ring 30 is placed adjacent an opposing side of the terminal end 26. The main, or primary fasteners of housings 12, 14 of BEC 10 include two fastener elements in the form of an externally threaded stud 32 and an internally threaded sleeve 34. Stud 32 passes through aligned hole 44 in upper housing 12, hole 41 in the printed circuit board subassembly 16, hole 43 in lower housing 14, hole 38 in the connector ring 28, hole 42 in terminal end 26, hole 39 in compression ring 30, and hole 40 in the connector assembly 18 to theaddedly mate with sleeve 34. The stud 32 has a first shoulder 46 that abuts a shoulder 48 in the bracket housing 23 and a second shoulder 50 that abuts the compression ring 30. The sleeve 34 has a first shoulder 52 that abuts a shoulder 53 in the upper housing 12 and a second end shoulder 54 that abuts the connector ring 28. The sleeve 34 has internal threads 56 that engage external threads 58 of stud 32.

As the sleeve 34 is tightened onto the stud 32, the upper housing 12, lower housing 14, printed circuit board subassembly 16, and the terminal housing 20 and bracket housing 23 of connector assembly 18 are mechanically drawn and fastened together to form the assembled BEC 10. Furthermore, the electrical connection between the power cable 24 and the printed circuit board subassembly 16 is made by the connector ring 28 being pressed against the terminal end 26 of the power cable 24. The compression ring 30 is calibrated to provide 8-10 Newtons of force to assure a good electrical connection between the terminal end 26 and connector ring 28.

In this fashion, a single sleeve and bolt assembly functions to provide both a mechanical assembly of the BEC and an electrical connection for the BEC.

Figure 4:
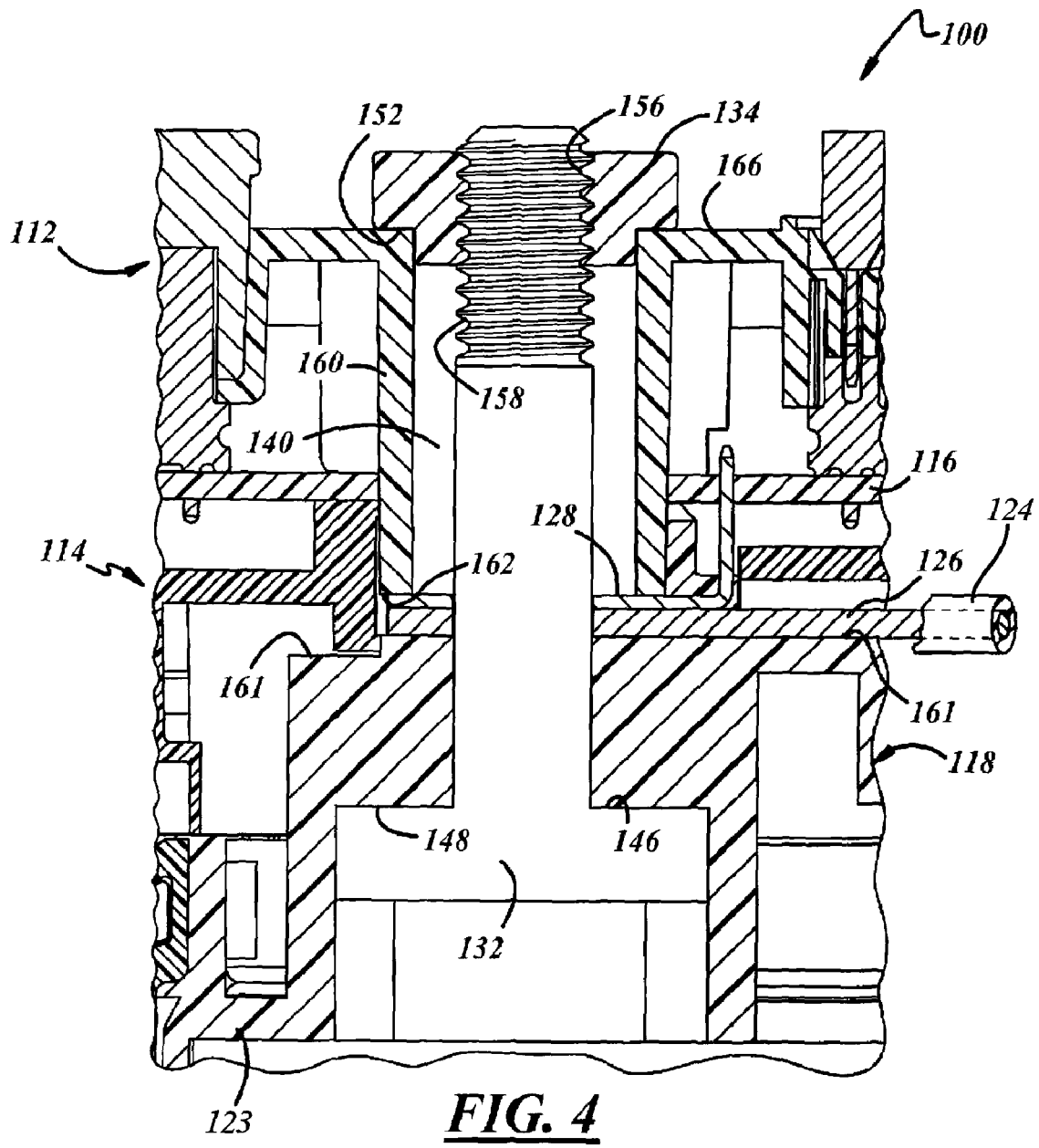
FIG. 4 is a view similar to FIG. 3 illustrating an alternative embodiment.

Referring now to FIG. 4, a modified BEC 100 is shown. In this embodiment, the stud 132 has an external threaded shank 158 that extends entirely through the BEC. The stud 132 has a shoulder 146 that opposes shoulder 148 in the bracket housing 123. A nut 134 with internal threads 156 engages the shank 158. The upper housing 112 has a downwardly depending wall 160 about its hole 140 with an end wall 162 that abuts the connector ring 128. The bracket housing 123 of the connector assembly 118 has a wall section 161 that abuts the bottom side of the terminal end 126 of the power cable 124. The nut 134 has a shoulder 152 that abuts the top surface 166 of the upper housing 112. The primary fasteners of BEC 100 are tightened in that nut 134 is tightened onto stud 132 so that the upper housing is pressed downwardly to drive the stamped metal connector ring 128 against the terminal end 126 of power cable, or cord 124 to electrically connect the printed circuit board subassembly 116 to the power cord 124. The bracket 123, lower housing 114, printed circuit board subassembly 116, and upper housing 112 are also all mechanically fastened together.

Other variations and modifications are possible without departing from the scope and spirit of the present invention as defined by the appended claims.

The embodiments in which an exclusive property or privilege is claimed are defined as follows.

The invention claimed is:

1. A bussed electrical center comprising:
    a power cable for feeding electrical power to said bussed electrical center, said power cable having a terminal end;
    a printed circuit board subassembly interposed between a first housing member and a second housing member that are connectable together;
    an electrically conductive connector having a prong end and a distal end, said prong end being operably connected to said printed circuit board;
    said distal end of said electrically conductive connector and said terminal end of said power cable being adjacent each other; and
    a first fastener and a second fastener positioned on opposite sides of said first and second housing members and operably engageable so that when said first and second fasteners are tightened together, the first and second housing members are drawn together to mechanically fasten the bussed electrical center together, said first and second fastener being primary fasteners that mechanically fasten the bussed electrical center together, and said distal end and said terminal end are in communication with at least one of said primary fasteners and are pressed against each other for electrical connection to each other when said primary fasteners draw the bussed electrical center together to electrically connect the power cable to the printed circuit board subassembly.

2. The bussed electrical center as defined in claim 1 further comprising:
    said distal end of said electrically conductive connector being in the form of a ring and mounted about one of said primary fasteners;
    said terminal end being in the form of a ring mounted about one of said primary fasteners;
    said first and second housing members and said printed circuit board subassembly positioned on one side of said terminal end and said distal end;
    a connector assembly positioned on another side of said terminal end and said distal end; and
    said distal end and said terminal end interposed between a pair of respective shoulders of one of said fasteners or said first housing member and said connector assembly.

3. The bussed electrical center as defined in claim 2 further comprising:
    a compression ring positioned between said first and second fasteners for providing a compression force as said primary fasteners are tightened together.

4. A bussed electrical center comprising:
    a power cable for feeding electrical power to said bussed electrical center, said power cable having a terminal end;
    a printed circuit board subassembly interposed between a first housing member and a second housing member that are connectable together;
    an electrically conductive connector having a prong end and a distal end, said prong end being operably connected to said printed circuit board;
    said distal end of said electrically conductive connector and said terminal end of said power cable being adjacent each other;
    a first fastener and a second fastener positioned on opposite sides of said first and second housing members and operably engageable together such that when said first and second fasteners are tightened together to draw the first and second housing members together to mechanically fasten the bussed electrical center together, said distal end and said terminal end are pressed against each other for electrical connection to each other to electrically connect the power cable to the printed circuit board subassembly; and
    a compression ring positioned between said first and second fasteners for providing a compression force as said fasteners are tightened together,
    wherein said distal end of said electrically conductive connector is in the form of a ring and mounted about one of said fasteners;
    said terminal end being in the form of a ring mounted about one of said fasteners;
    said first and second housing members and said printed circuit board subassembly positioned on one side of said terminal end and said distal end;
    a connector assembly positioned on another side of said terminal end and said distal end; and
    said distal end and said terminal end interposed between a pair of respective shoulders of one of,
       (i) said fasteners, and
       (ii) said first housing member and said connector assembly,
    said first fastener being a stud that is externally threaded and having a first shoulder engaging one of said first housing member and said connector assembly and having a second shoulder;
    said second fastener being a sleeve that is internally threaded and having a first shoulder engaging the other of said first housing member and said connector assembly and having a second shoulder at an end of said sleeve opposing said second shoulder of said stud; and
    said compression ring, said distal end of said electrically conductive connector, and said terminal end of said power cable being interposed and clamped between said second shoulder of said stud and second shoulder of said sleeve.

5. A bussed electrical center comprising:
a power cable for feeding electrical power to said bussed electrical center, said power cable having a terminal end;
a printed circuit board subassembly interposed between a first housing member and a second housing member that are connectable together;
an electrically conductive connector having a prong end and a distal end, said prong end being operably connected to said printed circuit board;
said distal end of said electrically conductive connector and said terminal end of said power cable being adjacent each other;
a first fastener and a second fastener positioned on opposite sides of said first and second housing members and operably engageable together such that when said first and second fasteners are tightened together to draw the first and second housing members together to mechanically fasten the bussed electrical center together, said distal end and said terminal end are pressed against each other for electrical connection to each other to electrically connect the power cable to the printed circuit board subassembly; and
wherein said distal end of said electrically conductive connector is in the form of a ring and mounted about one of said fasteners;
said terminal end being in the form of a ring mounted about one of said fasteners;
said first and second housings and said printed circuit board subassembly positioned on one side of said terminal end and said distal end;
a connector assembly positioned on another side of said terminal end and said distal end; and
said distal end and said terminal end interposed between a pair of respective shoulders of one of,
  (i) said fasteners, and
  (ii) said first housing member and said connector assembly,
said first fastener being a stud that is externally threaded and having a first shoulder section engaging one of said first housing member and connector assembly and having a second shoulder;
said second fastener being a sleeve that is internally threaded and having a first shoulder engaging the other said first housing member and said connector assembly and having a second shoulder at a distal end of said sleeve opposing said second shoulder of said stud; and
said distal end of said electrically conductive connector and said terminal end of said power cable being interposed and clamped between said second shoulder of said stud and second shoulder of said sleeve.

6. A bussed electrical center comprising:
a power cable for feeding electrical power to said bussed electrical center, said power cable having a terminal end;
a printed circuit board subassembly interposed between a first housing member and a second housing member that are connectable together;
an electrically conductive connector having a prong end and a distal end, said prong end being operably connected to said printed circuit board;
said distal end of said electrically conductive connector and said terminal end of said power cable being adjacent each other;
a first fastener and a second fastener positioned on opposite sides of said first and second housing members and operably engageable together such that when said first and second fasteners are tightened together to draw the first and second housing members together to mechanically fasten the bussed electrical center together, said distal end and said terminal end are pressed against each other for electrical connection to each other to electrically connect the power cable to the printed circuit board subassembly; and
a compression ring positioned between said first and second fasteners for providing a compression force as said fasteners are tightened together,
wherein said distal end of said electrically conductive connector is in the form of a ring and mounted about one of said fasteners;
said terminal end being in the form of a ring mounted about one of said fasteners;
said first and second housings and said printed circuit board subassembly positioned on one side of said terminal end and said distal end;
a connector assembly positioned on another side of said terminal end and said distal end; and
said distal end and said terminal end interposed between a pair of respective shoulders of one of,
  (i) said fasteners, and
  (ii) said first housing member and said connector assembly;
said first fastener being a stud that is externally threaded and having a shoulder section engaging one of said first housing member and said connector assembly;
said second fastener being a nut that is internally threaded and having a shoulder engaging the other said first housing and said connector assembly; and
said compression ring, said distal end of said electrically conductive connector, and said terminal end of said power cable being interposed and clamped between said first housing member and said connector assembly.

* * * * *